United States Patent
Bayer

[11] Patent Number: 5,901,997
[45] Date of Patent: May 11, 1999

[54] CONVEYOR DEVICE FOR VERTICALLY GUIDING PLATE-LIKE OBJECTS FOR ELECTROYLIC SURFACE-TREATMENT

[75] Inventor: Reinhold Bayer, Korntel-Münchingen, Germany

[73] Assignee: Lea Ronal GmbH, Birkenfeld, Germany

[21] Appl. No.: 08/860,447

[22] PCT Filed: Oct. 11, 1996

[86] PCT No.: PCT/DE96/01940

§ 371 Date: Jun. 26, 1997

§ 102(e) Date: Jun. 26, 1997

[87] PCT Pub. No.: WO97/15703

PCT Pub. Date: May 1, 1997

[30] Foreign Application Priority Data

Oct. 26, 1995 [DE] Germany .......................... 195 39 868

[51] Int. Cl.⁶ .................. B25B 1/42; B66C 1/00
[52] U.S. Cl. .................. 294/115; 118/423; 118/428; 118/500; 204/198; 204/297 R; 204/202; 204/269
[58] Field of Search ............ 204/198, 297 R, 204/202, 279, 269; 118/423, 428, 500; 294/100, 115, 116

[56] References Cited

U.S. PATENT DOCUMENTS 4,518,187  5/1985  Blatt et al. .................................. 294/88
5,102,287  4/1992  Johnson et al. ........................ 414/618

OTHER PUBLICATIONS

"Device For Opening And Closing Clamper Of Plating Hanger", Masuda Koichi et al., Japanese Abstract No. 06306691 published Jan. 11, 1994.

Primary Examiner—Kathryn Gorgos
Assistant Examiner—Wesley A. Nicolas
Attorney, Agent, or Firm—Pillsbury Madison & Sutro

[57] ABSTRACT

A transport device for conveying vertically oriented plate-like articles for chemical or electrolytic surface treatment, the device having clamping elements maintained in the manner of tongs, which can be actuated by means of a sliding body and a linkage mechanism for grasping a plate-like article. The linkage mechanism consists of two crank arms which are associated with each other and guided in such a way that the course of their movement consists of two sections, namely a spreading or clamping movement extending essentially horizontally for grasping and releasing the plate-like article to be held, and an essentially vertically extending lifting and lowering movement for dipping and removing the transport device in the respective treatment liquid for the plate-like article.

13 Claims, 4 Drawing Sheets

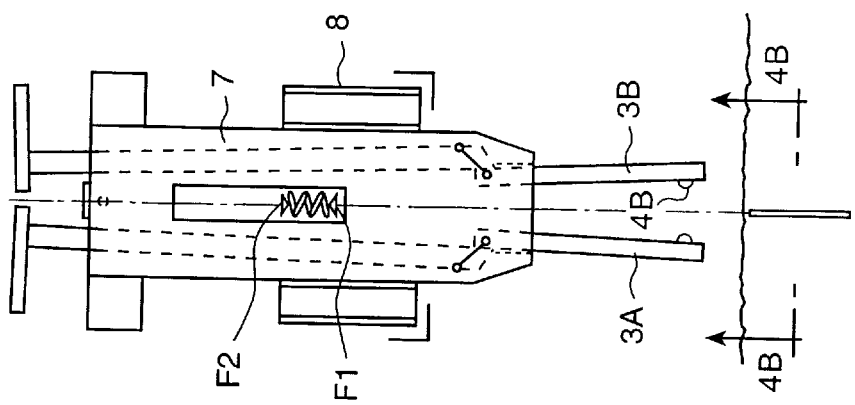
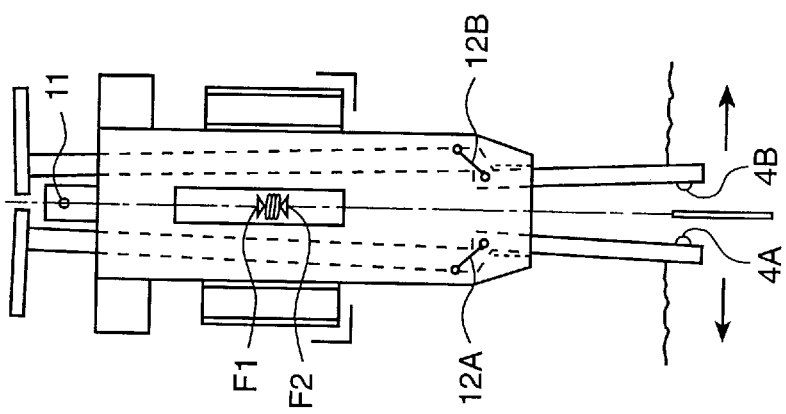
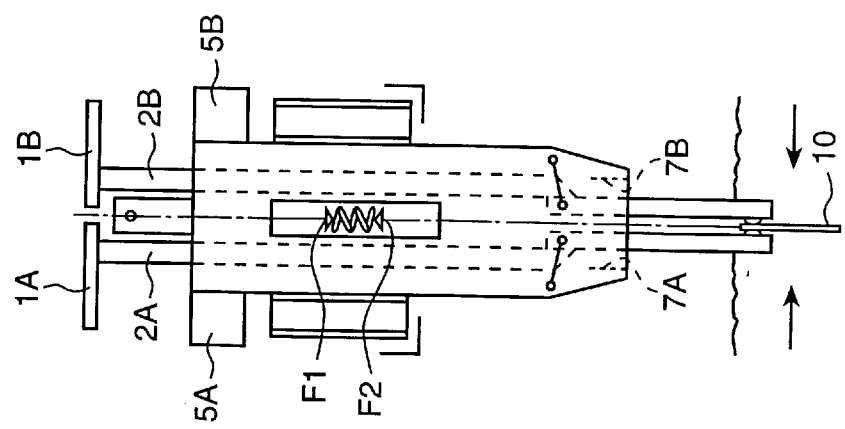

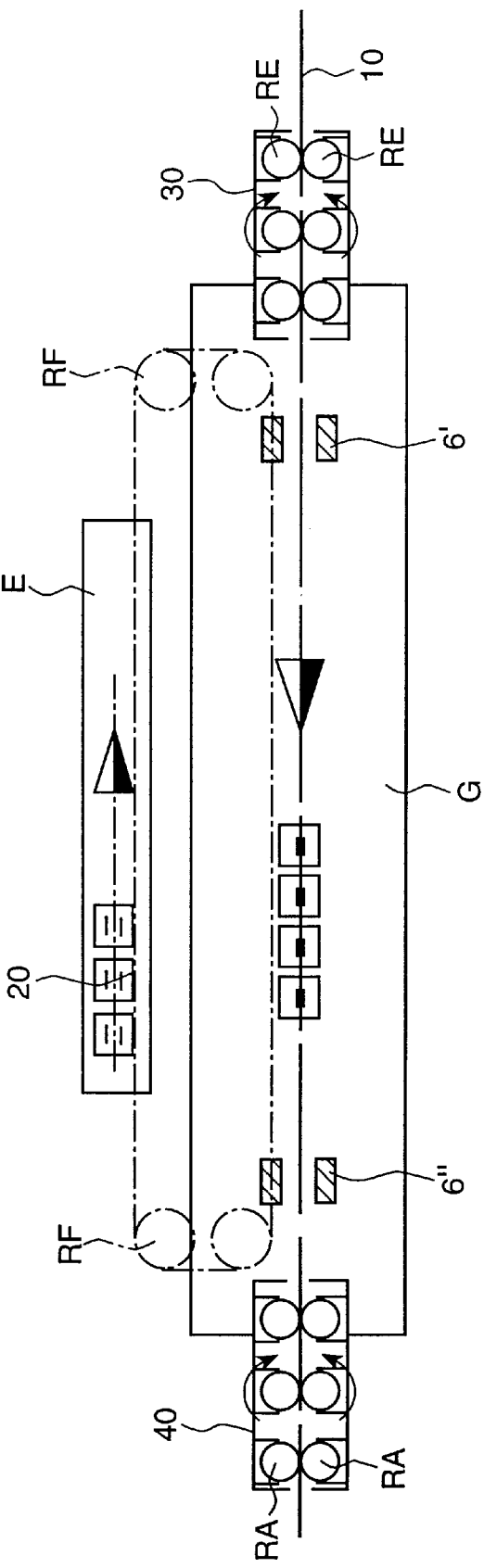
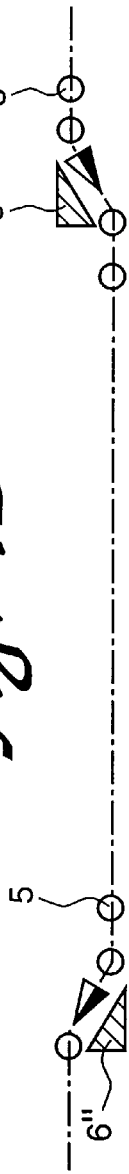

CONVEYOR DEVICE FOR VERTICALLY GUIDING PLATE-LIKE OBJECTS FOR ELECTROYLIC SURFACE-TREATMENT

This is a National Stage Application of PCT/DE96/ 01940, filed Oct. 11, 1996.

BACKGROUND OF THE INVENTION

1. Technical Field

The invention first relates to a transport device in accordance with the preamble of claim 1.

2. Prior Art

A transport apparatus of the type according to the species is known, for example, from JP 06306691 A, or also from DE 84 22 297 U1.

The subject of DE 84 22 297 U1 is essentially concerned with assuring the widest possible opening of the clamp-like lower pickup area in order to make possible an automatic or robot-like equipment of the transport device with printed circuit plates. To this end one leg of the clamp-like pickup area is embodied to be stationary, the other is fastened on a turntable, on which a vertically displaceable element, which in this embodiment is constituted by a spring-loaded piston rod, acts via a cam connection. When the piston rod is actuated by an external force, for example pneumatically, the turntable pivots the movable leg aside.

This geometry is extremely disadvantageous since, because of the predetermined lever ratio between the radius of the turntable on the one side and the distance of the pickup area for the printed circuit boards from the turning point of the turntable on the other side, only relatively weak holding forces can be exerted on the printed circuit boards, or the "particularly good clamping effect of the tongs", also desired in connection with the subject of this reference, can only be achieved with a very high spring force, which requires a correspondingly elaborate mechanical construction, as well as a very high actuation force as the counter-force to this spring for opening the tongs.

When establishing a transport system with a plurality of such transport devices, the latter are suspended on a support rail by means of a strap; accordingly, the large actuation force for opening the tongs requires elaborate and mechanically solid actuation devices on the support rail.

JP 06306691 A employs a rocker-like mechanism for opening and closing the clamp-like pickup area, wherein also a stationary leg and a gripping leg, seated in a rocker-like manner, are provided. The piston rod of an essentially vertically maintained cylinder acts on the upper end of this gripping leg via an elaborate mechanical rod system. The holding power of this clamping device is exclusively determined by a spring held between the two upper ends of the clamps, wherein the achievable holding force of this known device can be a multiple of the spring force because of an appropriately selected rocker-like seating. The piston rod must be retracted into the cylinder for opening the clamp, and the clamping rocker is then actuated via the linkage mechanism against the force of the spring. However, this quite compactly embodied transport device has the disadvantage of many hinges and pivot levers, and apparently is intended for the electrical or pneumatic opening/closing of the pickup area. This device is too elaborate and cumbersome for use in a transport system.

U.S. Pat. No. 5,102,287 discloses a similar device which, however, from the beginning is not intended for use with a transport system for chemical or electrolytic surface treatment; here, two symmetrically constructed and rocker-like maintained clamping elements are provided, which have control cams on their surfaces facing each other, on which a vertically operating plunger acts, by means of which the opening and the closing of the two clamps can be accomplished. Because of the design of these control cams it is possible to achieve a relatively large holding force between the ends of the two clamps wherein, however, also because of the disadvantageous selection of the lever arm between the clamp ends on the one side and contact points of the plunger with the clamps, this plunger must be charged with very high forces, which results in a correspondingly elaborate apparatus, as can be seen from the tall construction of the cylinder devices provided there. Therefore such a solution is not usable for employment in transport systems.

BRIEF SUMMARY OF THE INVENTION

It is therefore the object of the invention to improve the previously known transport devices in such a way that a dependable and defined gripping of the articles to be processed is assured, wherein high holding forces in particular are also intended to be achieved.

This object is attained in the manner described below and recited in the claims.

Thus, the basic concept of the invention is based on a uniform clamping device, which is conducted by means of only a single conveyor belt and whose holding elements permit an essentially horizontal opening and closing movement as well as a vertical lifting and lowering movement.

Further embodiments of the attainment of the object in accordance with the invention ensue from the dependent claims.

BRIEF DESCRIPTION OF SEVERAL VIEWS OF THE DRAWING

FIG. 4A is a schematic top plan view of the transport system.

FIG. 4B is a schematic side elevational view of several components of the system of FIG. 4A.

DETAILED DESCRIPTION OF THE INVENTION

Figure 1A:
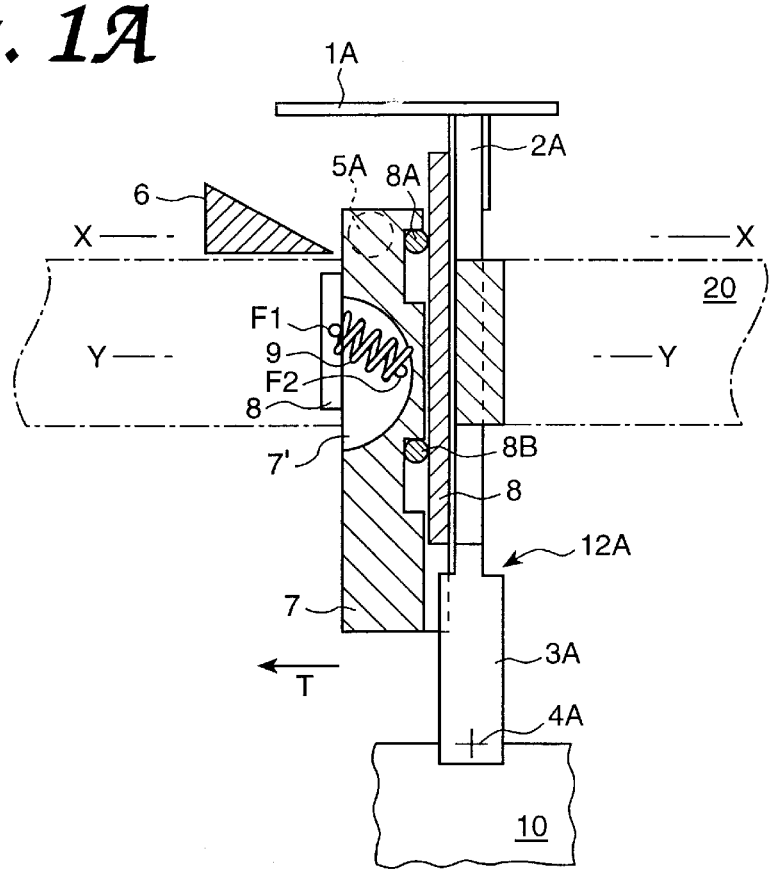
FIG. 1A is a vertical section through the transport device in the transport plane, the plane Z—Z of FIG. 1B.

FIGS. 1A and B show a conveyor belt 20 (or similar installation) in dash-dotted lines, on which a plurality of transport devices in accordance with the invention are maintained, which in turn are intended to transport plate-like articles 10, for example printed circuit boards to be coated, through a galvanic bath. The transport device is essentially embodied to be tong-like or clamp-like.

A clamp suspension 8, which is fixedly connected with the conveyor belt 20, is used for holding. In turn, the clamp suspension 8 encloses a sliding body 7 in a clamp-like manner, which is continuously displaceable between two height positions along a surface of the clamp suspension 8 between two detents 8A, 8B in appropriate recesses. On its side facing the inside of the clamp suspension 8, the sliding body 7 has a recess 7'; the first base point F1 of a pressure spring 9 is situated in the interior of the clamp suspension 8, and its second base point F2 is anchored on the bottom of the recess 7'. Since the relative position of the base point F2 in respect to the stationary base point F1 changes in the course of a displacement of the sliding body 7, this spring 9 causes a behavior such as will be described in detail further down below.

In its central area the clamp suspension 8 also comprises two clamp elements 2A, 2B as current conducting elements, each clamp element 2A, 2B supports an essentially horizontal contact plate 1A, 1B (FIGS. 2A–2C) on their respective upper end and are connected on their lower end by means of contact legs, or gripping legs, 3A, 3B via respective crank arms 12A, 12B. The clamp elements 2A, 2B are preferably made of titanium tubes filled with copper, by means of which a low-resistance transmission of even high galvanic currents is achieved.

The contact plates 1A, 1B are cathodically poled by means of contact brushes, not shown, maintained above the contact plates and thus at a safe distance from the corrosive galvanic bath, transmit the galvanizing current via the clamp elements 2A, 2B to contact points 4A, 4B on the contact legs 3A, 3B and in this way charge the articles 10 to be galvanized with cathode current.

The clamp elements 2A, 2B form an essentially tong-like structure, whose horizontal and vertical positioning can be clearly set by the position of the sliding body 7.

Figure 1B:
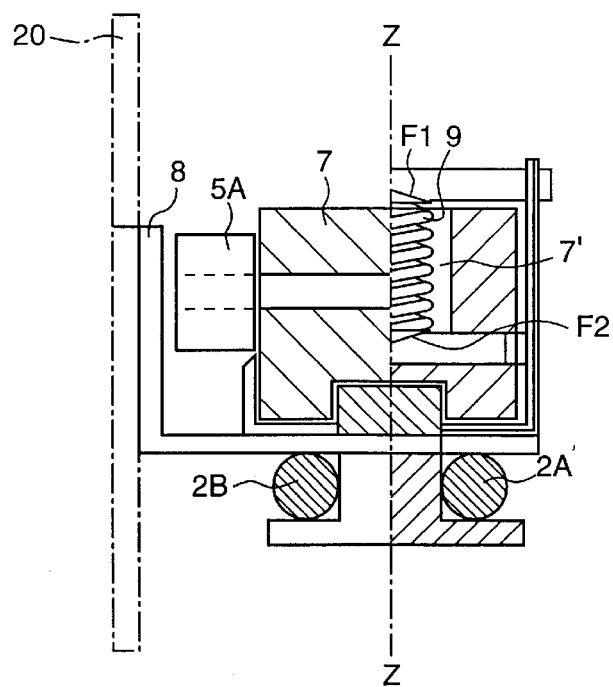
FIG. 1B is a horizontal section through the transport device in the planes X—X (left) and Y—Y (right) of FIG. 1A, FIGS. 2A, 2B and 2C are views of the transport device in the transport direction and in its essential positions.

To this end the sliding body 7 has a roller pair 5A, 5B on both sides, whose rollers have a common horizontal axis of rotation perpendicularly with the conveying direction T. Control elements 6, which are schematically represented as wedges in FIGS. 1 and 4, are provided for cooperation with this pair of rollers at suitable places, where a movement of the clamp is to take place (for example for grasping a flat article 10 such as a printed circuit board 10). The slide-up surface of these wedges is situated in the direction of movement of the roller pair 5A, 5B, so that in the position A represented in FIG. 2A during transport of the clamp in the conveying direction T, the roller pair 5A, 5B necessarily has to slide up on the associated wedges 6.

The course of movement of the clamp will now be explained in more detail by means of FIG. 2:

In the position represented in FIG. 2A, the sliding body 7 is in its lowest position and the crank arms, or linkage arms, 12A, 12B forming a linkage mechanism controlled by it in turn act on the clamp elements 2A, 2B in such a way that the two contact legs 3A, 3B are firmly pressed on both sides against the article 10 to be galvanized. Since in this case the base point F2 of the spring 9 lies below its stationary base point F1 on the clamp suspension 8, the expansion force or clamping force of the spring 9 accordingly acts continuously on the sliding body 7 and the crank arms 12A, 12B 12, so that, because of the lever-arm-like transmission of the spring force via the crank arms 12A 12B 12, the contact legs remain securely closed and hold the article 10 to be galvanized.

If now the roller pair 5A, 5B slides up on the wedges 6 (6'' in FIG. 4), a position as represented in FIG. 2B initially results:

The displacement of the sliding body 7 upward against the clamping force of the spring 9 initially causes a lateral pivoting-out of the contact legs 3A, 3B via the crank arms 12A, 12B as far as detents 7A, 7B of the sliding body to take place and the material to be galvanized is released. However, an essential change of the vertical position of the contact legs 3 is not yet connected with this.

Only the further sliding up of the roller pair 5A, 5B on the wedges 6 as far as the upper end position of the sliding body 7, as represented in FIG. 2C, also leads to the vertical "taking along" of the contact legs 3 upward, which in actuality means that the contact points 4A, 4B can be lifted out of the galvanic bath, whose surface is schematically represented in FIG. 2. In this way it is also easily possible to conduct the conveyor belt 20, and thus the clamps fastened on it, over the boundary walls of the galvanic bath G after the metal-coated material 10 to be coated has been grasped by other transport devices, not shown, and is conveyed out of the galvanic bath.

In the upper end position of the slide body 7 represented in FIG. 2C, the base point F2 is situated above the stationary base point F1, so that the vertical component of the clamping force of the spring 9, which is decisive here, is reversed upward in comparison with the position of the sliding body 7 represented in FIGS. 2A and 2B, with the result that the upper release position of the clamp represented in FIG. 2C, also is dependably maintained, once the roller pair 5A, 5B has left the control means 6.

If, following the return of the conveyor belt 20, the clamp again reaches the galvanic bath and is to dip into it and grasp article 10 to be galvanized, the described processes take place in a reversed sequence, as is schematically indicated in FIG. 4:

At the start of the galvanic bath G, the sliding body 7 is again pushed down against the upward directed clamping force of the spring 9 by means of an appropriately embodied and disposed control element 6', whereupon initially (still without a closing movement) the two contact legs 3A, 3B dip into the electrolyte, and the two contact points 4A, 4B are positioned on both sides of the edge of the article 10 to be galvanized. In the course of further displacement of the sliding body 7 downward, the two contact legs 3 then again grasp the material to be galvanized on both sides, wherein a considerable "strengthening" of the spring force 9 or its conversion into a holding force on both sides takes place by means of a corresponding pivoting of the crank arms 12A, 12B of the hinged connection 12.

The represented holding device is therefore characterized by two essential functional principles:

For one, because the holding force for the article to be galvanized in the lower, holding position, as well as the weight of the clamp in its upper, release position, are achieved by a directional change of the clamping force of the spring 9, and for another, because the essentially linear direction of movement of the sliding body 7 is converted into two successive movement courses by the interposition of the hinged connection 12, namely into an essentially horizontally extending spreading or moving apart of the contact legs 3, and a subsequent vertical movement of the contact legs upward in the course of the transition of the contact clamp from its holding into its releasing position or, in the reverse sequence, in the course of the transition from the release position to the holding position.

Figure 3:
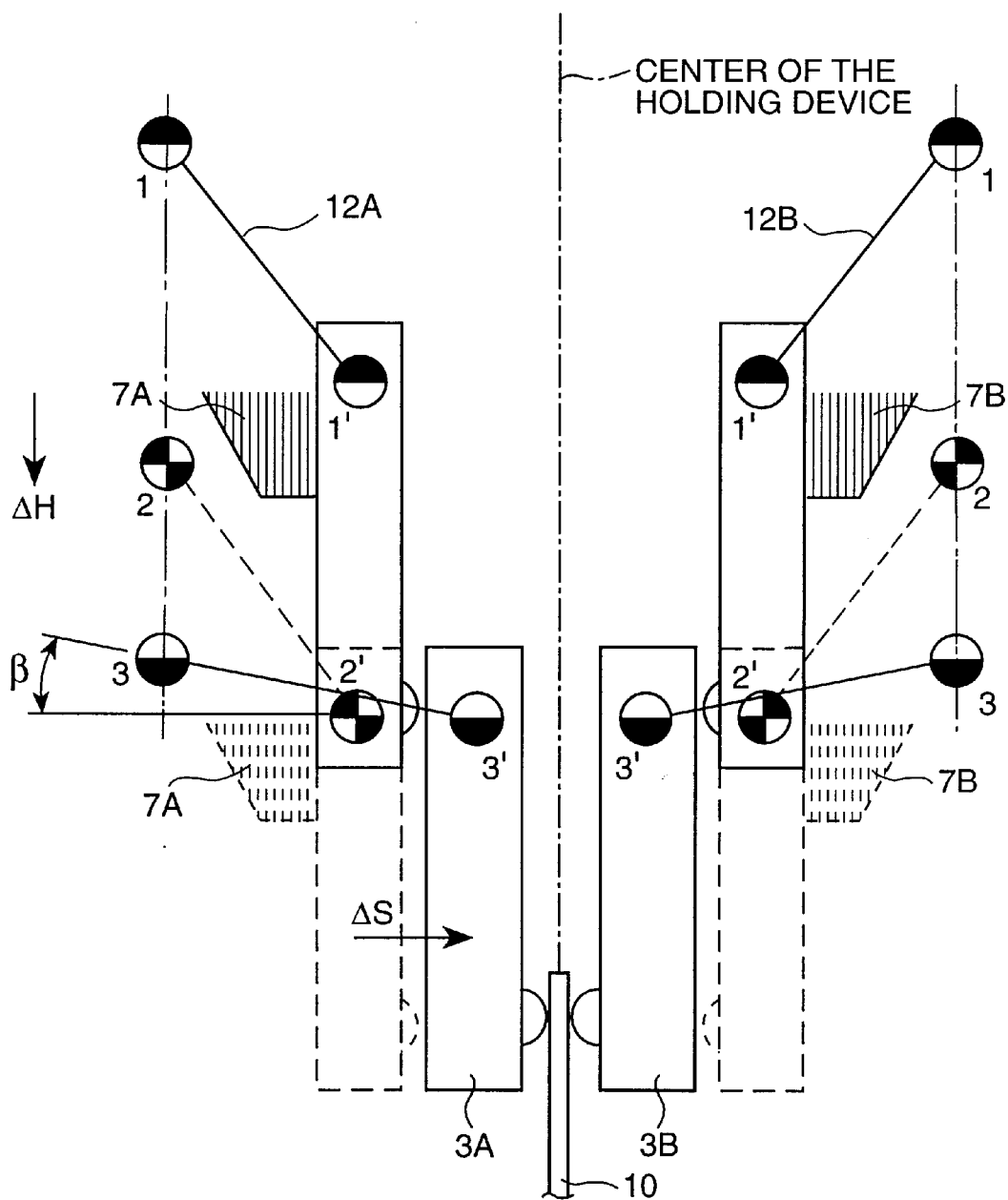
FIG. 3 is a schematic representation of the function of the hinge mechanism in the essential positions.

To make this "strengthening" clear, FIG. 3 is a schematic representation of the position of the two hinge points of the crank arms 12A, 12B:

The position (1) with the hinge points 1 on the slide body 7 and 1' on the contact leg 3A, 3B corresponds to the position in FIG. 2C; in the course of lowering the sliding body 7 into the position (2) (corresponds to the position in FIG. 2B), the geometric conditions do not change, the crank arms connecting the hinge points 2/2' remain in their angular position, thus the displacement path 1–2 of the sliding body 7 is identically converted into a sliding path 1'–2' of the contact legs 3A, 3B of the same length.

In the course of the transition from the position (2) into the position (3), the crank arms 12A, 12B are no longer vertically displaced, but pivot, and in this way cause the closing movement of the contact legs 3A, 3B, on whose end the gripping or holding of the article 10 to be galvanized takes place. In the represented position (3) at an angle β of approximately 10° to 20° between the horizontal and the crank arms 12A, 12B, a downward displacement of the sliding body 7 by ΔH only causes an inward displacement ΔS smaller by a factor of ⅕. Since accordingly the ratio ΔH ΔS lies around 5, each differential sliding force ΔF along the path ΔH causes a closing or clamping force higher by approximately 5 times on the closing path ΔS.

FIG. 4A schematically shows a top plan view on the conveyor belt 20 in its relative positioning in respect to the material 10 to be galvanized, which consists of individual elements, for example printed circuit boards, and is transported through the galvanizing bath G FIG. 4B is a schematic side elevational view showing the path followed by rollers 5A, 5B through both G and past wedges 6' and 6". In the coating area between the control wedges 6' and 6" (anode area), the clamps hold their associated printed circuit board in the position represented in FIG. 2A, then follows the spreading (FIG. 2B) and lifting of the contact legs (FIG. 2C), whereupon the clamps are again transported back to the entry into the galvanic bath over the return path by means of their conveyor belt 20; an installation E for deplating the contact points 4A, 4B can be usefully provided in the area of the return path.

An inlet unit 30 and an outlet unit 40 are disposed in the inlet and outlet area of the galvanic bath G at the front ends which, in the exemplary embodiment represented, contain three vertically positioned roller pairs RE (in the inlet unit) or RA (in the outlet unit). The two rollers of each pair of rollers are pressed against each other by means of suitable spring devices, so that, together with schematically indicated sealing lips, they can help to seal of the ends of the galvanic bath G, where the printed circuit boards to be coated are fed into it and are again taken out of it.

A further task of the roller pairs RE/RA consists in the active feeding or the removal of the articles 10 to be coated into the active area of the transport devices fastened on the conveyor belt 20, and to do this exactly synchronized with the conveying speed of the conveyor belt. To this end the roller pairs are connected with drive means, not represented, which are suitably also assigned to the schematically indicated four conveyor rollers RF of the conveyor belt 20. Following a one-time adjustment of, for example, suitable gear devices, it is then assured that the exact synchronization of the conveying speed of the articles 10 to be coated with the transport devices on the conveyor belt 20 in the inlet area and the outlet area of the galvanic bath G can be permanently assured. This also characterizes another advantage of this embodiment of the attainment of the object in accordance with the invention, for example in contrast to DE 39 29 728 of the species, where lip seals are provided for sealing the galvanic bath in the inlet and outlet area of the articles to be coated. Such lip seals constitute an interfering element with the synchronization of the conveyor belts with suitable feeding and removal devices, since the effect of their force on the articles conducted through them can be estimated and defined only within certain limits, so that this constitutes an interference factor which can lead to speed tolerances in connection with the feeding of the articles to be coated, which can result in undesired relative speeds between transport devices on the one hand and articles to be coated and intended to be gripped by the latter, on the other hand, in the inlet area, or to undesired effects and force stresses on the transport devices in the outlet area. Because the roller pairs of the device in accordance with the invention themselves take on the essential sealing functions and they themselves define the feeding speed and the removal speed, relative speeds between the conveyor belt and the articles to be coated can at least be minimized.

In the above described exemplary embodiment, the surface treatment of the articles is constituted by their being coated in a galvanic bath. It is of course understood that the structure and manner of operation of the device in accordance with the invention are independent of the effects and the result of the respective bath. The transport devices in accordance with the invention can therefore be employed wherever a chemical or electrolytic surface treatment is intended, such as before or after actual galvanization, for example.

I claim:

1. A transport device for conveying vertically oriented articles for a surface treatment, said transport device comprising:
   two clamp elements having lower ends provided with gripping legs;
   a sliding body which is vertically displaceable between two end positions in response to a vertical displacement force;
   a clamp suspension supporting said sliding body; and
   a linkage mechanism coupling said gripping legs to said sliding body, said linkage mechanism comprising two linkage arms each connected between said sliding body and a respective one of said gripping legs, said linkage arms being configured and operable for moving said gripping legs toward one another into a gripping position for gripping an article and away from one another into a release position for releasing the article, in response to vertical movement of said sliding body between said end positions wherein said linkage mechanism is operable for:
   converting the vertical displacement force on said sliding body into a gripping force applied to said gripping legs for gripping an article, which gripping force is greater than the vertical displacement force, and
   converting the vertical displacement of said sliding body into two successive movement courses of said gripping legs, the two successive movement courses including an essentially horizontally extending movement course, and an essentially vertically extending movement course, during movement of said gripping legs toward or away from one another.

2. The transport device in accordance with claim 1, characterized in that the vertical displacement force on the sliding body (7) is provided, at least in the gripping position of the gripping legs (3A, 3B), by a pressure spring (9), which is held between a first base point (F1) on the clamp suspension (8) and a second base point (F2) at the sliding body (7) so that a vertical component of the spring force acts on the sliding body (7).

3. The transport device in accordance with claim 2, characterized in that in the lower end position of the sliding body (7), said gripping legs are in the gripping position and the first base point (F1) at the clamp suspension (8) lies above the second base point (F2) at the sliding body, and that in the upper position of the sliding body (7), said gripping legs are in the release position and the base point (F1) lies below the base point (F2), so that in the releasing position, too, the weight of the clamp elements is absorbed by the vertical component of the spring force.

4. The transport device in accordance with claim 1, characterized in that the clamp elements (2A, 2B) are embodied as current conducting elements, so that the transfer of a galvanic current from contact plates (1A, 1B) at the upper ends of the clamp elements (2A, 2B) takes place via the linkage arms (12A, 12B) directly to contact points (4A, 4B) on the gripping legs (3A, 3B).

5. The transport device in accordance with claim 1, characterized in that each of said linkage arms (12A, 12B) has an S-shape.

6. A transport system comprising several transport devices each in accordance with claim 2, which are moved revolvingly and synchronously with the conveyed speed of the articles and which grasp and hold the articles in predetermined areas, characterized in that the transport devices are held on a conveyor belt (20) via their respective clamp suspensions (8), and that control means which act reciprocally are disposed on the one side in the area of the conveying path and on the other on the sliding body (7) of each of said transport devices, by means of which the vertical movement of the sliding members of the transport devices between the end positions can be controlled.

7. The transport system in accordance with claim 6, characterized in that the control means comprise a roller pair (5A, 5B) on each said sliding body and wedge elements (6) in the conveying path of the roller pair (5A, 5B), by means of which each said sliding body (7) can be displaced at least far enough vertically that the vertical component of the force of the spring (9) is reversed.

8. The transport system in accordance with claim 6, characterized in that the surface treatment is an electrolytic surface treatment performed in a galvanic bath that has an inlet end and an outlet end and the conveyor belt (20) is driven synchronously with the transport devices, with vertically arranged inlet pairs (RE,) which, at the inlet end of the galvanic bath (G), grasp the articles (10) to be coated and transfer the articles in the galvanic bath to the transport devices, and vertically arranged outlet roller pairs (RA) which take the articles over from the transport devices at the outlet end of the galvanic bath.

9. The transport system in accordance with claim 8, characterized in that the inlet roller pairs (RE) are a part of an inlet unit (30) and the outlet roller pairs (RA) are a part of an outlet roller unit (40), the inlet unit and the outlet unit being disposed at opposite ends of the galvanic bath (G).

10. The transport system in accordance with claim 9, characterized in that at least one roller of each roller pair is resiliently held so that the rollers of each roller pair are pressed against each other and seal the galvanic bath (G) at the inlet end in a passage area of the articles (10) at least as much as possible.

11. The transport system in accordance with claim 6, characterized in that in the course of the return travel of the transport devices, the transport devices are conducted through a trough-shaped deplating device (E), in which a suitable electrolyte is fed into the area of contact points (4A, 4B) on the gripping legs (3A, 3B).

12. The transport system in accordance with claim 8, characterized in that at least one roller of each roller pair is resiliently held so that the rollers of each roller pair are pressed against each other and seal the galvanic bath (G) at the inlet end in a passage area of the articles (10) at least as much as possible.

13. The transport system in accordance with claim 1, wherein the surface treatment is an electrolytic surface treatment.

* * * * *